(12) United States Patent
Ogawa et al.

(10) Patent No.: US 8,116,042 B2
(45) Date of Patent: *Feb. 14, 2012

(54) MAGNETORESISTANCE DEVICE

(75) Inventors: Susumu Ogawa, Cambridge (GB); Andrew Troup, Woodhead (GB); David Williams, Cambridge (GB); Hiroshi Fukuda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 384 days.

This patent is subject to a terminal disclaimer.

(21) Appl. No.: 12/390,557

(22) Filed: Feb. 23, 2009

(65) Prior Publication Data

US 2009/0303639 A1 Dec. 10, 2009

(30) Foreign Application Priority Data

Jun. 9, 2008 (EP) ..................................... 08157887

(51) Int. Cl.
*G11B 5/33* (2006.01)

(52) U.S. Cl. ................ 360/313; 360/318.1; 360/327.21; 360/327.24

(58) Field of Classification Search ............... 360/318.1, 360/327.21, 327.24
See application file for complete search history.

(56) References Cited

U.S. PATENT DOCUMENTS

| | | | |
|---|---|---|---|
| 4,978,938 A * | 12/1990 | Partin et al. | 338/32 R |
| 2004/0207031 A1 | 10/2004 | Berndt et al. | |
| 2004/0257894 A1 | 12/2004 | Onogi et al. | |
| 2006/0289984 A1 | 12/2006 | Fontana, Jr. et al. | |
| 2008/0130355 A1 | 6/2008 | Saitoh et al. | |

OTHER PUBLICATIONS

European Search Report 08157887.4, Nov. 4, 2008.

* cited by examiner

*Primary Examiner* — Tan T. Nguyen
(74) *Attorney, Agent, or Firm* — Antonelli, Terry, Stout & Kraus, LLP.

(57) ABSTRACT

A device capable of exhibiting the extraordinary magnetoresistance (EMR) effect includes an elongate channel formed of silicon. A conductor comprising heavily doped silicon is connected to the channel along one side of the channel so as to provide a shunt. A gate arrangement including a gate electrode is provided on the channel. Applying a bias of appropriate polarity and sufficient magnitude to the gate electrode results in the formation of an inversion layer in the channel.

17 Claims, 11 Drawing Sheets

MAGNETORESISTANCE DEVICE

FIELD OF THE INVENTION

The present invention relates to a magnetoresistance device particularly, but not exclusively, for use as a magnetic field sensor or a read head in a hard disk drive.

BACKGROUND

Hard disk drives (HDDs) are widely used for high-density information storage. HDDs are commonly found in computer systems traditionally associated with this type of storage, such as servers and desktop computers. However, HDDs having smaller form factors, such as 1-inch drives, can also be found in hand-held electronic devices, such as music players and digital cameras.

Higher storage capacity in HDDs can be achieved by increasing storage density. Storage density is currently doubling roughly every year and the highest storage density presently achievable using conventional technology, such as by recording data in bit cells which are arranged longitudinally in the magnetic recording medium and reading data using so-called "spin value" read heads, is about 100 Gb/in$^2$.

However, as storage density in HDDs continues to increase, then recording media and read heads encounter the problem of the superparamagnetic effect.

The superparamagnetic effect arises when the size of a ferromagnetic grain is sufficiently reduced that the energy required to change direction of magnetisation of the grain is comparable to the thermal energy. Thus, the magnetisation of the grain is liable to fluctuate and so lead to data corruption.

For recording media, a solution to the problem has been demonstrated which involves arranging bit cells perpendicularly (rather than longitudinally) to the surface of the recording medium which allows each bit cell to be large enough to avoid the superparamagnetic effect.

To address this problem in read heads, it been proposed to avoid using any ferromagnetic material and to take advantage of the so-called extraordinary magnetoresistance (EMR) effect.

A device exhibiting the EMR effect is described in "Enhanced Room-Temperature Geometric Magnetoresistance in Inhomogeneous Narrow-Gap Semiconductors", by S. A. Solin, T. Thio, D. R. Hines and J. J. Heremans, Science volume 289, p. 1530 (2000). The device is arranged in a van der Pauw configuration and includes a highly conductive gold inhomogeneity concentrically embedded in a disk of non-magnetic indium antimonide (InSb). At zero applied magnetic field (H=0), current flows through the gold inhomogeneity. However, at non-zero applied magnetic field (H≠0), current is deflected perpendicularly to the field-line distribution, around the gold inhomogeneity and through the annulus. This gives rise to a drop in conductance.

However, this device suffers several drawbacks and so is ill suited to being used as read head. For example, the device has a configuration which is not suited to being scaled down to smaller dimensions, is heavily depleted and exhibits strong boundary and interface scattering. Furthermore, indium antimonide is an expensive material and has poor mechanical properties, which makes it difficult to process and to provide a reliable, long-lasting sensor.

Currently, high mobility narrow gap semiconductors with low carrier density, such as indium antimonide ($\mu_n$=7×10$^4$ cm$^2$V$^{-1}$s$^{-1}$ at 300° K), indium arsenide ($\mu_n$=3×10$^4$ cm$^2$V$^{-1}$s$^{-1}$ at 300° K) and gallium arsenide ($\mu_n$=8.5×10$^3$ cm$^2$V$^{-1}$s$^{-1}$ at 300° K), seem to be the best candidates for EMR-based read heads. However, these materials also tend to be expensive material and have poor mechanical properties.

EP-A-1 868 254 describes a device exhibiting the extraordinary magnetoresistance effect having a channel formed of silicon. A conductor formed of titanium silicide or highly-doped silicon acts as a shunt and is connected to the channel along one side of the channel. Leads are connected to and spaced along the channel on the opposite side of the channel.

Silicon is cheaper than high mobility materials, such as indium antimonide, and is easier to process. However, device performance tends to be poorer because silicon has lower mobility.

The present invention seeks to provide an improved magnetoresistance device.

SUMMARY

According to a first aspect of certain embodiments of the present invention there is provided a magnetoresistance device having a channel comprising non-ferromagnetic semiconducting material, a conductor comprising non-ferromagnetic material having a higher conductivity than the semiconducting material and connecting at least two sections of the channel, a plurality of leads connected to and spaced apart along the channel and a gate structure comprising a gate electrode separated from the channel by a gate dielectric for applying an electric field to the channel.

The gate structure can be used to form an inversion layer in the channel in an undoped or lightly-doped semiconducting material which has a higher mobility than the same but heavily-doped semiconducting material which would otherwise be needed to reduce the resistance of the device and so improve device performance.

The channel may comprise silicon or silicon germanium.

The channel may be undoped or may be doped with an impurity having a concentration up to about 1×10$^{16}$ cm$^{-3}$.

The conductor may be arranged laterally to the channel and/or the conductor extends along the channel.

The conductor may comprise semiconducting material, such as silicon or silicon germanium. The conductor may be doped with an impurity having a concentration of at least about 1×10$^{19}$ cm$^{-3}$.

The channel and the conductor may be coplanar. The channel and conductor may be provided in a layer of semiconducting material disposed on an insulating layer. The channel and conductor may be provided in a semiconductor substrate at its surface.

The insulating region may be disposed on the channel and the gate electrode may be disposed on the insulating region. The gate structure may be a top gate structure wherein the gate dielectric is disposed on the channel and the gate electrode is disposed on the gate dielectric. The gate electrode may comprise a doped semiconducting material such as doped silicon, a metal, such as aluminium, or metal alloy.

The device may be a read head for a hard disk drive.

According to a second aspect of certain embodiments of the present invention there is provided the device and a magnetic field source, the magnetic field source and device arranged such that, when a magnetic field is applied to the device, the magnetic field is arranged along a line passing through the gate electrode and the channel.

According to a third aspect of certain embodiments of the present invention there is provided a method of operating a magnetoresistance device having a channel comprising non-ferromagnetic semiconducting material, a conductor comprising non-ferromagnetic material having a higher conductivity than the semiconducting material and connecting at least two sections of the channel, a plurality of leads connected to and spaced apart along the channel and a gate electrode separate from the channel by an insulating region, the method comprising applying a bias of appropriate polarity and sufficient magnitude so as to result in formation of an inversion layer in the non-ferromagnetic semiconducting material.

The method may further comprise driving a current between two leads and measuring a voltage developed between two leads.

According to a fourth aspect of certain embodiments of the present invention there is provided a method of fabricating a magnetoresistance device, the method comprising providing a layer of non-ferromagnetic semiconducting material, providing a layer of insulating material on the semiconducting material layer, providing a layer of conducting material on the insulating material layer, patterning said insulating and conducting material layers so as to form an mask and define unmasked regions of the semiconducting material layer and implanting ions into the unmasked regions of the semiconducting material layer.

Providing the layer of non-ferromagnetic semiconducting material may comprise providing a doped substrate or may comprise providing the layer on an underlying insulating layer.

BRIEF DESCRIPTION OF THE DRAWINGS

Certain embodiments of the present invention will now be described, by way of example, with reference to the accompanying drawings in which.

DETAILED DESCRIPTION OF CERTAIN EMBODIMENTS

First Embodiment

Figure 1:
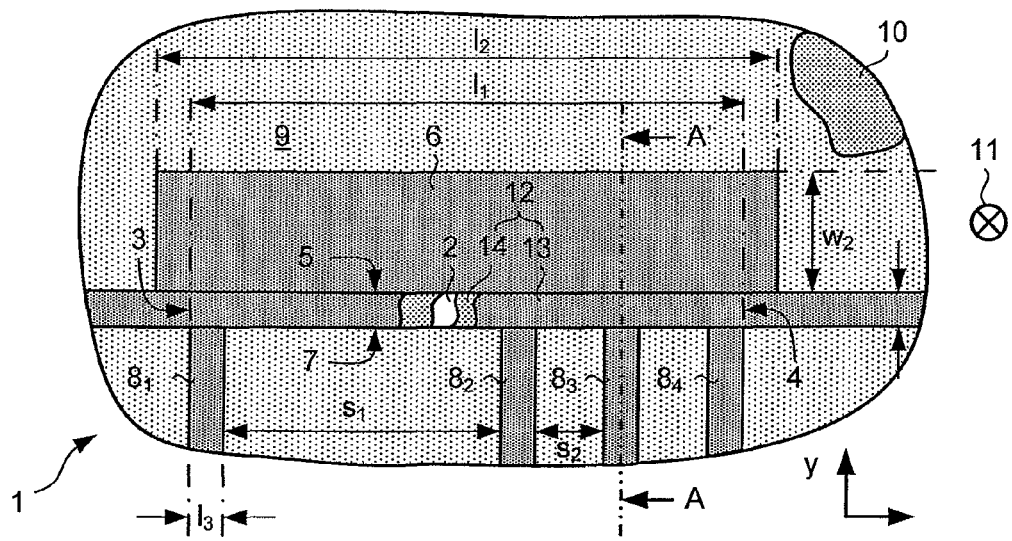
FIG. 1 is a plan view of a first embodiment of a magnetoresistance device in accordance with the present invention.
Figure 2:
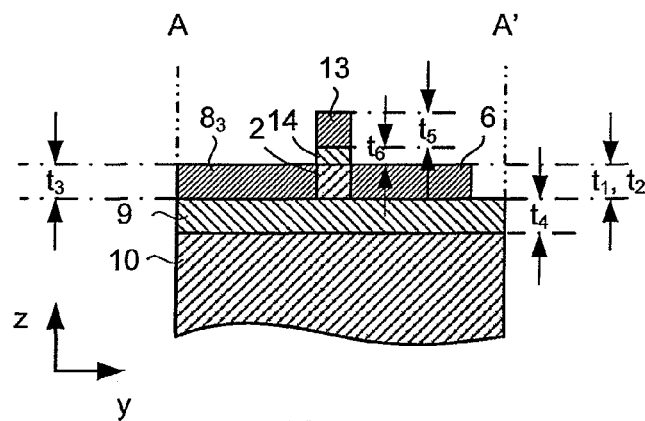
FIG. 2 is a cross-sectional view of the device shown in FIG. 1 taken along the line A-A'.

Referring to FIGS. 1 and 2, a first embodiment of a magnetoresistance device 1 according to the present invention is shown.

The device 1 includes a channel 2 formed of undoped single crystal silicon (Si) having a thickness, $t_1$, of about 50 nm. The channel 2 extends between first and second points 3, 4 (herein also referred to as "ends" or "portions") and has connected thereto, along a first side 5, a conductor or region 6 formed of heavily-doped single crystal silicon having a thickness, $t_2$, of about 50 nm. On a second, opposite side 7 of the channel 2, first, second, third and fourth leads $8_1$, $8_2$, $8_3$, $8_4$ are connected to and spaced apart along the channel 2. The leads $8_1$, $8_2$, $8_3$, $8_4$ are formed of heavily-doped single crystal silicon having a thickness, $t_3$, of about 50 nm. The first, second, third and fourth leads $8_1$, $8_2$, $8_3$, $8_4$ are arranged in order along the channel 2 with the first lead $8_1$ closest to the first end 3 (in FIG. 1 shown as the left-hand edge) and the fourth lead $8_4$ closest to the other (i.e. second) end 4.

The heavily-doped single crystal silicon region 6 connects at least two portions of channel 2 and is herein referred to as a "shunt". The channel 2, shunt 6 and leads $8_1$, $8_2$, $8_3$, $8_4$ are arranged on an insulating layer 9 in the form of a buried layer of silicon dioxide ($SiO_2$) having a thickness, $t_4$, of about 150 nm. The insulating layer 9 is disposed on a p-type silicon substrate 10 having a conductivity of about 10 $\Omega$cm. In FIG. 1, for illustrative purposes, the insulating layer 9 is shown partially cut away to reveal the underlying substrate 10.

Figure 8:
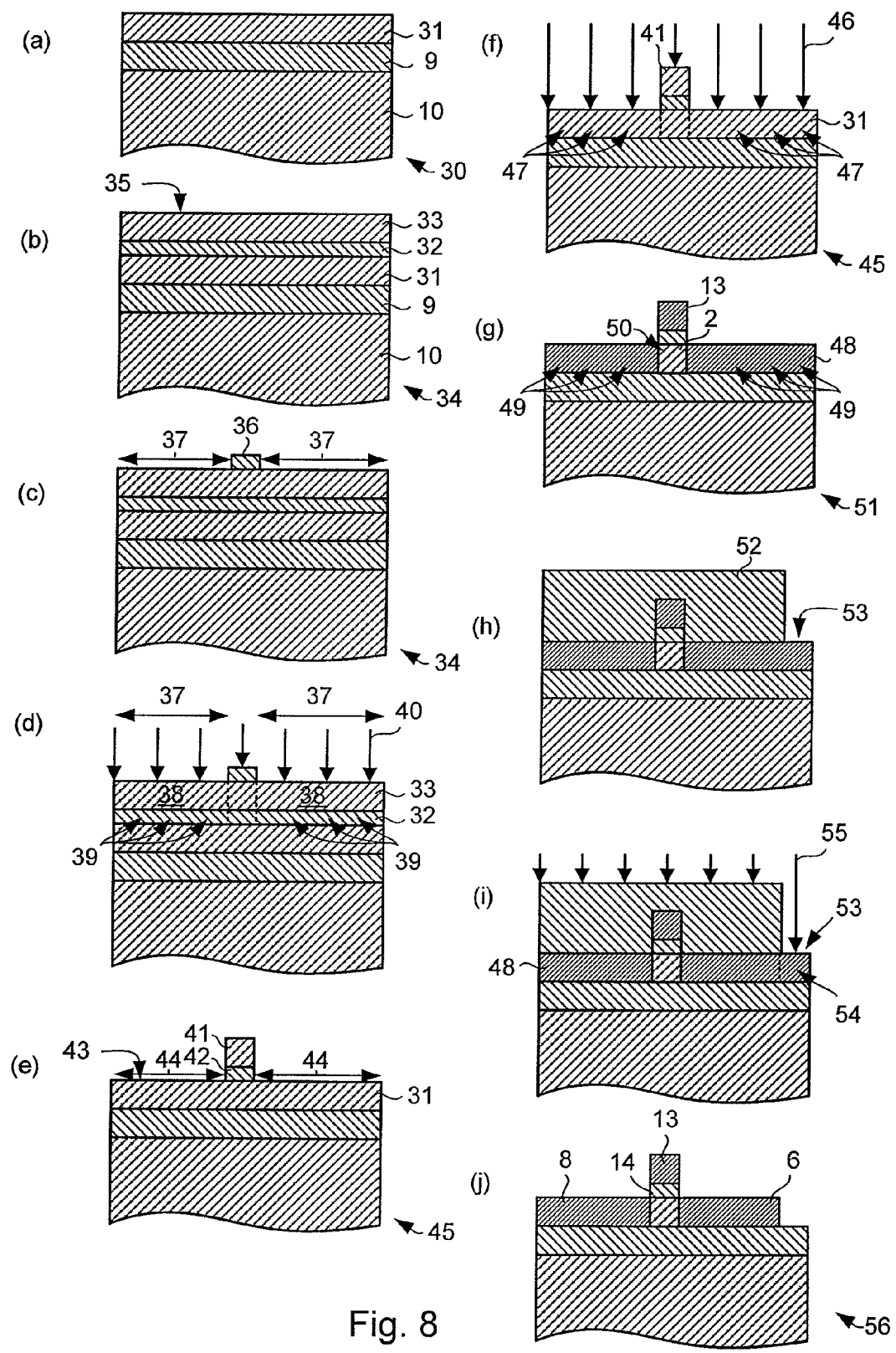
FIGS. 8a to 8j illustrate the device shown in FIG. 1 at different stages during fabrication.

The channel 2, shunt 6 and leads $8_1$, $8_2$, $8_3$, $8_4$ are coplanar and are formed from the same layer of single crystal silicon 31 (FIG. 8a). Thus, the shunt 6 and the leads $8_1$, $8_2$, $8_3$, $8_4$ are connected to the sides 5, 7 of the channel 2, i.e. laterally, and, in this case, have the same thickness, i.e. $t_1 = t_2 = t_3$.

The channel 2 is undoped such that it has an impurity concentration of about or less than $10^{15}$ $cm^{-3}$. In some embodiments, the channel may be undoped or low doped such that the impurity concentration is equal to or less than $10^{16}$ cm$^{-3}$. The shunt 6 and leads $8_1$, $8_2$, $8_3$, $8_4$ are doped with n-type impurity in the form of arsenic (As) to a concentration of about $1 \times 10^{20}$ cm$^{-3}$. As will be explained later in more detail, the shunt 6 and the leads $8_1$, $8_2$, $8_3$, $8_4$ are selectively doped whereas the channel 2 is not doped by using masked ion implantation.

The channel 2 is elongated and has an effective length, $l_1$, of about 17 µm and a width, $w_1$, of about 1 µm. The shunt 6 is also elongated and rectangular in plan view having a length, $l_2$, of about 17.5 µm and a width, $w_2$, of about 4 µm. The leads $8_1$, $8_2$, $8_3$, $8_4$ each have a width, $l_3$, i.e. length along the channel 2, of about 500 nm. The first and second leads $8_1$, $8_2$, are spaced apart having spacing, $s_1$, of about 9 µm. The second, third and fourth leads $8_1$, $8_3$, $8_4$ are spaced apart having spacing, $s_2$, of about 3 µm. The leads $8_1$, $8_2$, $8_3$, $8_4$ can be thinner and can be closely spaced. For example, the device can be scaled down for use as a read head in a hard disk drive capable of storing a terabyte (TB) of data such that the second, third and fourth leads $8_2$, $8_3$, $8_4$ are spaced apart having spacing, $s_2$, of about 20 to 30 nm. In FIG. 1, longitudinal and transverse axes of the channel 2 are shown as x- and y-axes respectively and the crystal growth axis is shown as the z-axis.

In operation, the magnetoresistance device 1 exhibits the extraordinary magnetoresistance (EMR) effect and can be used to detect a magnetic field 11 passing or having a component directed along the axis perpendicular to the plane in which the channel 2 and shunt 6 lie, i.e. x-y plane.

The device 1 includes a top gate structure 12. The gate structure 12 includes a gate electrode 13 formed of a layer of doped polycrystalline silicon (Si) having a thickness, $t_5$, of about 100 nm and a gate dielectric 14 formed from a layer of silicon dioxide (SiO$_2$) having a thickness, $t_6$, of about 2 nm. As will be explained in more detail later, the gate electrode 13 provides a mask for implantation. Thus, the gate electrode 13 providing a suitable mask can be thicker or thinner. The gate dielectric 14 separates and electrically isolates the gate electrode 13 from the channel 2. The gate electrode 13 is arranged so that, when the device 1 is properly used, the gate electrode 13 is perpendicular to the applied magnetic field 11. In FIG. 1, for illustrative purposes, the gate electrode 13 is shown partially cut away to reveal the gate dielectric 14 lying underneath and the gate dielectric 14 is also shown partially cut away to reveal the underlying channel 2.

As will be explained in more detail later, the gate structure 12 can be used to apply a sufficient high electric field to the channel 2 to form an inversion layer 19 (FIGS. 4a & 4b) in the channel 2 between the shunt 6 and leads $8_1$, $8_2$, $8_3$, $8_4$. Thus, the gate structure 12 allows low-doped silicon to be used in the channel 2 with reasonable resistance which provides high output signals, e.g. of the order of 0.1 mV, 1 mV or greater at ±50 mT, and low contact resistance, e.g. of the order of $10^{-7}$ Ωcm$^{-2}$.

Figure 3:
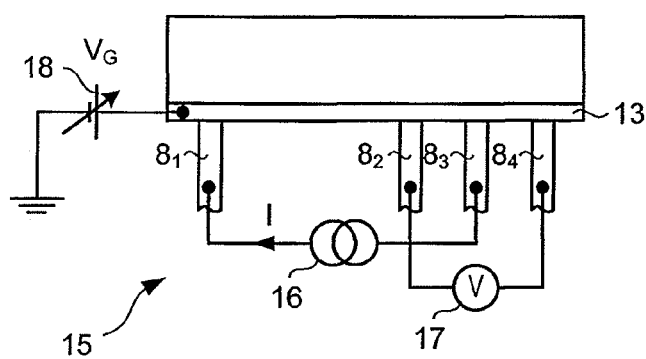
FIG. 3 is a schematic view of circuit arrangement for operating the device shown in FIG. 1.

Referring to FIG. 3, a circuit configuration 15 for operating the magnetoresistance device 1 is shown. The circuit configuration 15 includes a current source 16 configured to drive current, I, through the channel 2 between the first lead $8_1$ and the third lead $8_3$ and a voltmeter 17 configured to measure voltage, V, developed across the second and fourth leads $8_2$, $8_4$. This configuration can be referred to as an "IVIV" configuration, geometry or arrangement. A voltage source 18 is used to apply a bias, $V_G$, to the gate electrode 13.

Figure 4A:
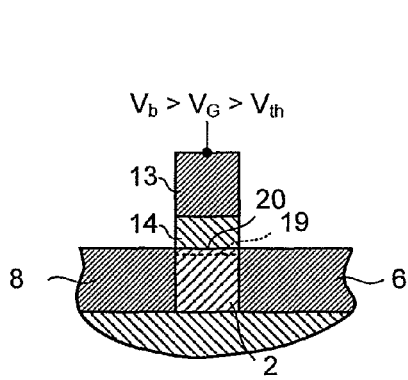
FIGS. 4a and 4b illustrate formation of an inversion layer in the device shown in FIG. 1.
Figure 4B:
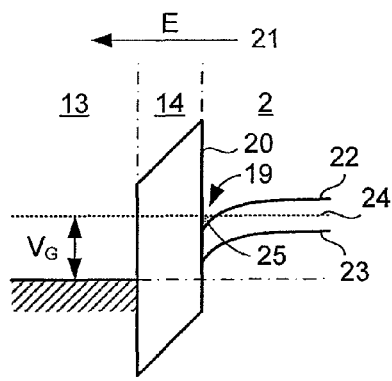

Referring to FIGS. 4a and 4b, an inversion layer 19 is formed in the channel 2 adjacent to an interface 20 between the gate dielectric 14 and the channel 2 when a sufficiently large voltage, $V_G$, exceeding a threshold voltage, $V_{th}$, but not exceeding a gate dielectric breakdown voltage, $V_b$, is applied to the gate electrode 13. Values for the threshold voltage $V_{th}$ and the gate dielectric breakdown voltage, $V_b$, can be found by routine experiment. The values usually depend on the material chosen for the channel 2 and the gate dielectric 14 and the thickness of the gate dielectric 14.

Referring in particular to FIG. 4b, applying a voltage to the gate electrode 13 generates an electric field 21 at the interface 20 causing the conduction and valence bands 22, 23 in the channel 2 to bend. If a sufficiently large voltage, $V_G$, is applied to the gate electrode 13, then the electric field 21 causes the conduction band 22 to bend below the Fermi level 24 and form a potential well 25 in which free electrons can accumulate, i.e. to form an inversion layer 19.

FIGS. 4a and 4b illustrate band bending resulting in accumulation of electrons. If a sufficiently large gate voltage of opposite polarity is applied, which exceeds another threshold voltage, then this can result in hole accumulation. However, the mobility of electrons is usually higher than the mobility of holes, i.e. $\mu_e > \mu_h$, and so device performance based on electron accumulation is used here.

Figure 5:
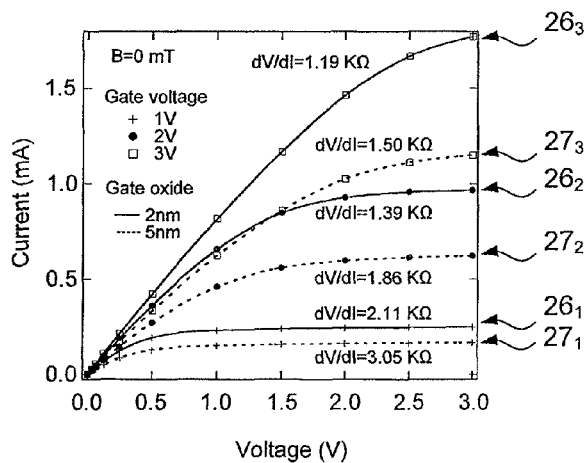
FIG. 5 illustrates current-voltage characteristics of the device shown in FIG. 1 at three different gate voltages and in the absence of an applied magnetic field.

FIG. 5 illustrates current-voltage characteristics $26_1$, $26_2$, $26_3$ of the device 1 (FIG. 1) at three different gate voltages, namely $V_G=1V$, 2V and 3V, in the absence of an applied magnetic field, i.e. B=0 mT. FIG. 5 also illustrates corresponding current-voltage characteristics $27_1$, $27_2$, $27_3$ of a similar device (not shown) having a gate dielectric thickness of about 5 nm at the same three gate voltages also in the absence of an applied magnetic field, i.e. B=0 mT. The measurements are taken at room temperature, i.e. at about 300° K.

The measurements are taken using the circuit configuration 15 shown in FIG. 3 in which voltage, V, is measured between the first and third leads $8_1$, $8_3$ as a function of current, I, between the second and fourth leads $8_2$, $8_4$ and a gate voltage, $V_G$. However, the measurements can be taken using a so-called "IVVI" geometry in which current flows between the first and fourth tabs $8_1$, $8_4$ and the voltage is sensed between the second and third tabs $8_2$, $8_3$.

In FIG. 5, values of differential resistance, dV/dI, measured in an approximately linear region near the origin, for different gate voltages are also shown. As shown in FIG. 5, when a gate voltage is applied of about 1 to 3V, the resistance between first and third electrodes $8_1$, $8_3$ is few kΩ. The shunt 6 and electrodes leads $8_1$, $8_2$, $8_3$, $8_4$ have negligible contact resistances.

Figure 6:
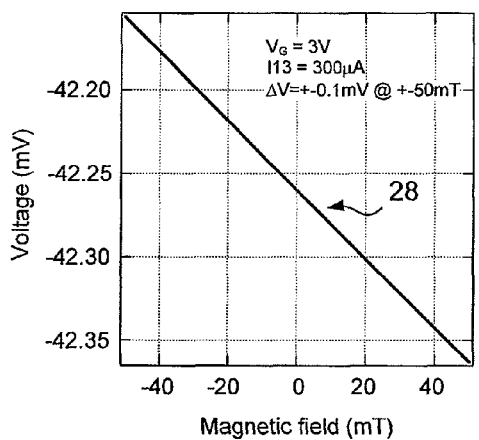
FIG. 6 illustrates voltage-magnetic field characteristic of the device shown in FIG. 1 at a fixed current and gate voltage.

FIG. 6 shows a voltage-magnetic field characteristic 28 of the device 1 (FIG. 1) at one gate voltage, namely $V_G=3V$, and at one current, namely I=300 µA, driven between the first and third leads $8_1$, $8_3$. The measurement is taken using the same configuration and in which voltage, V, is sensed between the second and fourth leads $8_2$, $8_4$ and sweeping magnetic field (applied perpendicular to the plane of the channel) between −50 mT to +50 mT.

As shown in FIG. 6, the device 1 outputs a signal which is about two orders of magnitude greater than a device described in EP-A-1 868 254 of similar size and having similar channel geometry.

Figure 7:
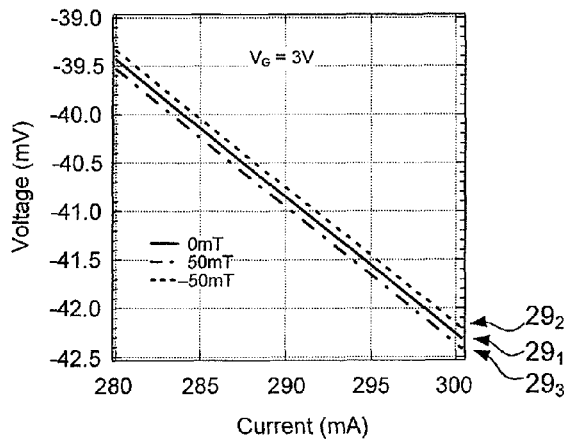
FIG. 7 illustrates voltage-current characteristic of the device shown in FIG. 1 at a fixed gate voltage at three different values of magnetic field.

FIG. 7 illustrates voltage-current characteristics $29_1$, $29_2$, $29_3$ of the device 1 (FIG. 1) at one gate voltage, namely $V_G=3V$ and at three different applied magnetic fields, namely, B=0 mT, +50 mT and −50 mT. The measurement is taken using the same configuration and in which voltage, V, is sensed between the second and fourth leads $8_2$, $8_4$ while sweeping current, I, driven through the channel 2 between the first and third leads $8_1$, $8_3$, between 280 and 300 µA.

As shown in FIG. 7, output voltage, V, is nearly proportional to current, I.

Thus, the device 1 exhibits a change in output signal with change of magnetic field, in other words a magneto resistance, namely ΔV=1 mV at ΔB=50 mT for I=3 mA and $V_G$=3V.

Referring to FIGS. 8a to 8j, a method of fabricating the device 1 will now be described.

Referring in particular to FIG. 8a, a silicon-on-insulator wafer 30 is provided having crystalline silicon layer 31, a buried silicon dioxide layer 9 and crystalline silicon substrate 10. The silicon layer 31 has a thickness of about 50 nm. The silicon dioxide layer 31 has a thickness of about 150 nm. A naturally forming silicon dioxide layer overlying silicon layer 31 and which is usually referred to as the "surface oxide" is omitted from FIG. 8a for clarity.

The wafer 30 is processed in the following way:

The wafer is cleaned using a 3:1 $H_2SO_4:H_2O_2$ (commonly known as a "Piranha etch"). Then, the surface oxide (not shown) is removed by a short dip in 2:5:3 $NH_2F:C_2H_4O_2$:$H_2O$ (also known as a "SILOX etch") and loaded into a reactor chamber (not shown).

Referring in particular to FIG. 8b, a layer 32 of silicon dioxide ($SiO_2$) having a thickness of 2 nm is grown by wet oxidation (i.e. oxidation in $H_2O$) at about 800° C. followed by a layer 33 of $n^+$ polycrystalline silicon 33 having a thickness of 100 nm by chemical vapour deposition (CVD).

At this stage the wafer 34 may be divided into chips. The wafer 34 (or a chip) may be processed further as follows:

The wafer is cleaned using a Piranha etch, followed by a dip in a SILOX etch. A layer (not shown) of PMMA is applied (e.g. spun-on) to an upper surface 35 of the wafer 34 and cured by baking.

The PMMA layer (not shown) is patterned using a scanning electron beam and developed using a mixture of IPA and water to leave a patterned PMMA layer (not shown). The chip is given a short, for example 3-minute, oxygen plasma ash, then a 30-nm thick layer of aluminium is thermally evaporated over the PMMA-patterned surface of the chip. The developed resist is "lifted-off" in acetone, then rinsed in IPA to leave an aluminium etch mask 36 (which provides a so-called "hard etch mask") and unmasked areas 37 of the wafer 34 as shown in FIG. 8c.

Referring to FIG. 8d, in the unmasked areas 37, regions 38, 39 of the silicon and silicon dioxide layers 32, 33 are etched by a reactive ion etch 40 using a mixture of carbon tetrafluoride and silicon tetrachloride ($CF_4:SiCl_4$) as a feed gas.

The aluminium etch mask 36 is removed using a base, such as $(CH_3)_4NOH$.

In some embodiments, soft etch mask, such as an e-beam resist, may be used. A negative resist may be used instead of a positive resist.

Referring to FIG. 8e, the structure of the device at this stage in processing is shown. A patterned silicon layer 41 and a coextensive underlying silicon dioxide layer 42 lie on an upper surface 43 of the undoped polycrystalline silicon layer 31.

The patterned silicon and silicon dioxide layers 41, 42 provide an implantation mask leaving areas 44 of a partially patterned wafer 45 unmasked.

Referring to FIG. 8f, the wafer 45 is cleaned and loaded into an ion implantation chamber (not shown). Arsenic (As) ions 46 at about 5 keV are implanted into the patterned silicon layer 41 (which is unmasked) and unmasked regions 47 of the crystalline silicon layer 31. The wafer 45 is annealed, in this case by laser annealing to activate the implant.

Referring to FIG. 8g, implantation leaves a layer 48 of polycrystalline silicon having doped and undoped regions 49, 50 and a doped polycrystalline silicon gate electrode 13. The undoped region 49 of the polycrystalline silicon 48 corresponds to the channel 2.

The wafer 51 is cleaned using acetone and IPA. A layer (not shown) of optical resist is spun-on. The optical resist layer (not shown) is patterned using a mask (which is also referred to as a reticle) and a UV light source and developed using an optical resist developer.

Referring to FIG. 8h, optical lithography stage leaves a patterned optical resist layer 52 defining the shunt 6 (FIG. 1) and the leads $8_1$, $8_2$, $8_3$, $8_4$ (FIG. 1) and leaving an unexposed area 53.

Referring to FIG. 8i, in the unmasked areas 54, regions 54 of the polycrystalline silicon 48 are etched by a reactive ion etch 55 using a mixture of carbon tetrafluoride and silicon tetrachloride ($CF_4:SiCl_4$) as a feed gas.

Referring to FIG. 8j, etching defines the shunt 6 and leads 8 which are co-planar with the channel 2. The gate electrode 13, gate dielectric 14 and channel 2 are self-aligned.

The wafer 56 is processed still further to form ohmic contacts/contact pads (not shown), e.g. formed of aluminium, for contacting the leads 8 and gate electrode 13.

If not already divided into chips, the wafer 56 is divided into chips at this stage and the chips are packaged. As will be described later, the device 1 can be used in a read head in a hard disk drive.

Second Embodiment

Figure 9:
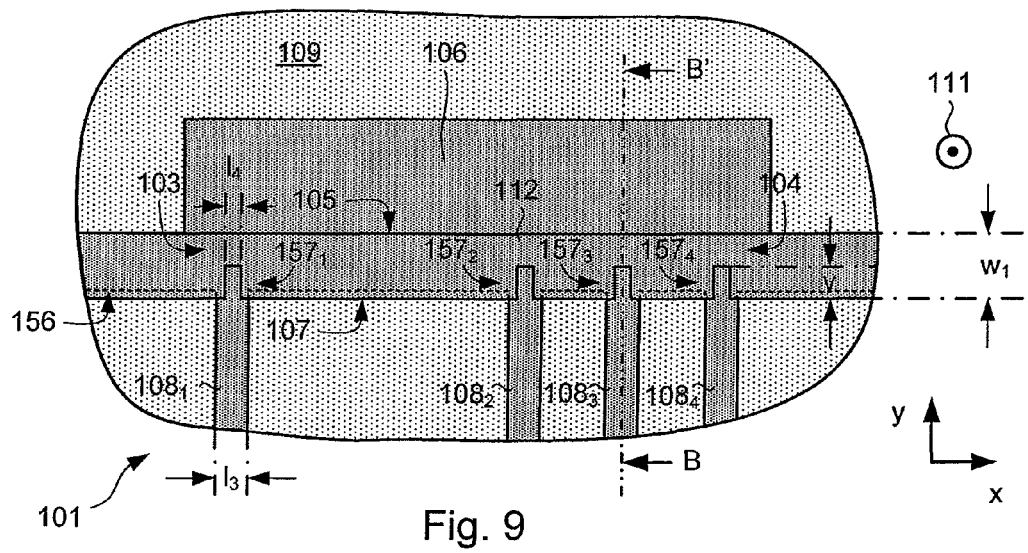
FIG. 9 is a plan view of a second embodiment of a magnetoresistance device in accordance with the present invention.
Figure 9A:
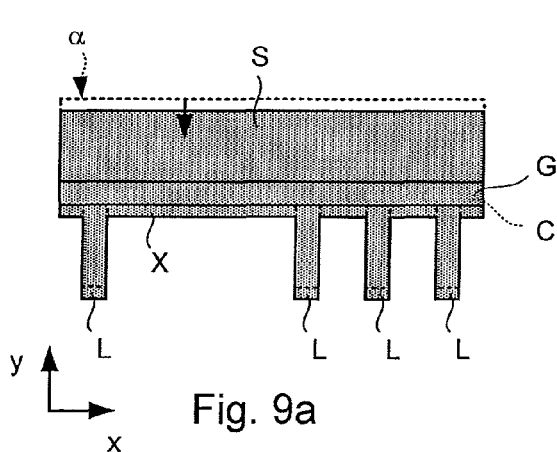
FIG. 9a illustrates alignment of shunt and leads to a gate structure.

Referring to FIG. 9a, a plan view of a magnetoresistance device having a channel C, top gate structure G, shunt S and leads L is shown. The device is fabricated using a process similar to that hereinbefore described and is used to help explain why a modified gate structure can be used.

When aligning an etch mask which defines the shunt S and leads L with respect to the gate structure G, if an alignment error in the y-axis (Δy) is particularly large, then the etch mask may be offset from its intended position α (shown in dashed outline). This may result in highly-doped unetched portions of the material used to form the shunt S and leads L being left along the channel C on the same side as the leads L, thus forming one or more shorts X between the leads L. If a short X is sufficiently low resistance, then this can render the device unusable as a sensor.

One solution is to use a wider gate structure G and so allow greater processing tolerance. However, this can result in device having a resistance which is too low.

Figure 10:
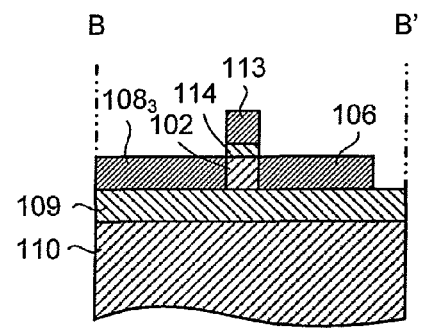
FIG. 10 is a cross-sectional view of the device shown in FIG. 9 taken along the line B-B'.

Referring to FIGS. 9 and 10, a second embodiment of a magnetoresistance device 101 according to the present invention is shown.

The second magnetoresistance device 101 is similar to the first magnetoresistance device 1 (FIGS. 1 and 2) hereinbefore described. The second device 101 includes a channel 102 extending between first and second ends 103, 104. The channel 102 has connected thereto, along a first side 5, a shunt 106 and, on a second, opposite side 107 of the channel 102, first, second, third and fourth leads $108_1$, $108_2$, $108_3$, $108_4$. The device 101 also includes a top gate structure 112 comprising a gate electrode 113 and gate dielectric 114. The channel 102, shunt 106 and leads $108_1$, $108_2$, $108_3$, $108_4$ are arranged on a silicon dioxide layer 109 disposed on a p-type silicon substrate 110 in the same way as described earlier.

The channel 102, shunt 106, leads $108_1$, $108_2$, $108_3$, $108_4$, gate electrode 113 and gate dielectric 114 have substantially the same layer thicknesses and dimensions and are formed from the same materials using the same process as the channel 2 (FIG. 1), shunt 6 (FIG. 1) and leads $8_1, 8_2, 8_3, 8_4$ (FIG. 1), electrode 13 (FIG. 1) and gate dielectric 14 (FIG. 1) described earlier.

The device 101 is controlled using the same circuit configuration 15 shown in FIG. 3. In operation, the device 101 exhibits the EMR effect and can be used to detect a magnetic field 111 perpendicular to the layers in which the channel 102 and shunt 106 are formed.

Referring in particular FIG. 9, the second device 101 differs from the first device 1 (FIG. 1) in that the gate structure 112 is wider (i.e. $w_1$ is larger) and has slots $157_1, 157_2, 157_3, 157_4$ roughly aligned along its length (i.e. along the x-axis) with the leads $108_1, 108_2, 108_3, 108_4$.

A lower edge 156 of a main portion of an etch mask (not shown) which defines the extent or outline of the shunt 106 and leads $108_1, 108_2, 108_3, 108_4$ and also the gate structure 112 is shown in FIG. 9. It will be appreciated that the etch mask (not shown) does not form part of the finished device 101.

When patterning the etch mask (not shown), the lower edge 156 of the main portion of the etch mask is aligned (in the y-direction) so that it crosses the slots $157_1, 157_2, 157_3, 157_4$, in other words to fall between the upper and lower boundaries of the slots $157_1, 157_2, 157_3, 157_4$. Lead portions of the etch mask (not shown) are aligned (in the x-direction) so that they coincide with the slots $157_1, 157_2, 157_3, 157_4$.

The slots $157_1, 157_2, 157_3, 157_4$ each have a width, $l_4$, i.e. in a direction along the channel 102, and a length, v, i.e. in a direction across the channel 2. As shown in FIG. 9, the slots $157_1, 157_2, 157_3, 157_4$ are narrower than the leads $108_1, 108_2, 108_3, 108_4$, i.e. $l_3 > l_4$. However, in some embodiments, the slots $157_1, 157_2, 157_3, 157_4$ are wider the leads $108_1, 108_2, 108_3, 108_4$, i.e. $l_4 > l_3$. The slots $157_1, 157_2, 157_3, 157_4$ have a length, v, which is proportion of the channel/gate width, $w_1$, e.g. $v \approx 0.5 w_1$. In this example, the channel 102 has a width, $w_1$, of about 2 μm and the leads $108_1, 108_2, 108_3, 108_4$ have a width, $l_3$, of about 500 nm.

Third Embodiment

Figure 11:
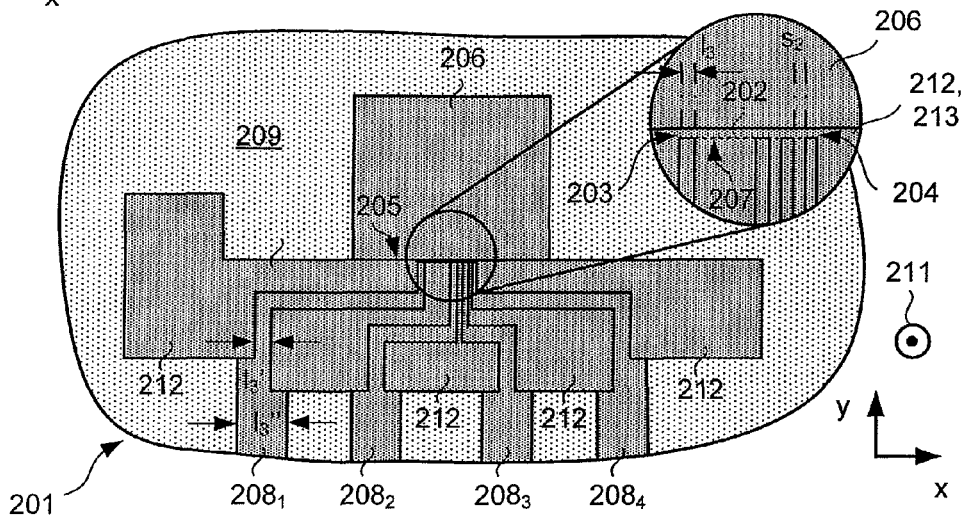
FIG. 11 is a plan view of a third embodiment of a magnetoresistance device in accordance with the present invention.

Referring to FIG. 11, a third embodiment of a magnetoresistance device 201 according to the present invention is shown.

The third magnetoresistance device 201 is similar to the first magnetoresistance device 1 (FIGS. 1 and 2) hereinbefore described. The second device 201 includes a channel 202 extending at least between first and second points 203, 204. The channel 202 has connected thereto, along a first side 205, a shunt 206 and, on a second, opposite effective (or "open") side 207 of the channel 202, first, second, third and fourth leads $208_1, 208_2, 208_3, 208_4$. The device 201 also includes a top gate structure 212 comprising a gate electrode 213 and gate dielectric (not shown). The channel 202, shunt 206 and leads $208_1, 208_2, 208_3, 208_4$ are arranged on a silicon dioxide layer 209 disposed on a p-type silicon substrate 210 in the same way as described earlier.

The channel 202, shunt 206, leads $208_1, 208_2, 208_3, 208_4$, gate electrode 213 and gate dielectric 214 have substantially the same layer thickness and are formed from the same materials as the channel 2 (FIG. 1), shunt 6 (FIG. 1) and leads $8_1, 8_2, 8_3, 8_4$ (FIG. 1), electrode 13 (FIG. 1) and gate dielectric 14 (FIG. 1) described earlier.

The third device 201 differs from the first device 1 (FIG. 1) in that the channel 202, shunt 206, leads $208_1, 208_2, 208_3, 208_4$ and gate structure 212 are smaller and have a slightly different arrangement.

The shunt 206 and leads $208_1, 208_2, 208_3, 208_4$ are defined by both relatively high resolution lithography, such as electron-beam lithography, and relatively low resolution lithography, such as photolithography. This allows leads $208_1, 208_2, 208_3, 208_4$ to be formed having widths, $l_3$, and to be spaced apart along the channel 202 by as little as 20 nm or even lower, i.e. $l_3 \approx s_2 \approx 20$ nm. However, further away from channel 202 between different parts of the gate structure 212, the leads $208_1, 208_2, 208_3, 208_4$ have a width, $l_3'$, of about 100 nm and, even further away from the channel 202 beyond the gate structure 212, the leads $208_1, 208_2, 208_3, 208_4$ have a width, $l_3''$, of about 500 nm.

The device 201 is controlled using the same circuit configuration 13 shown in FIG. 3. In operation, the device 201 exhibits the EMR effect and can be used to detect a magnetic field 211 passing or having a component directed along the axis perpendicular to the plane in which the channel 202 and shunt 206 lie.

Fourth Embodiment

Figure 12:
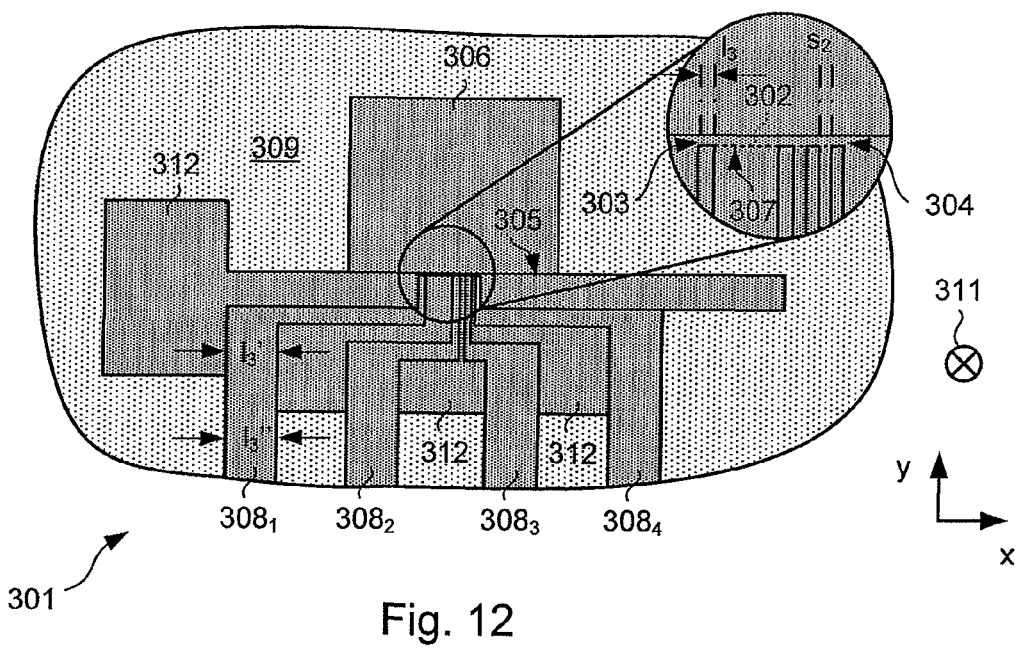
FIG. 12 is a plan view of a fourth embodiment of a magnetoresistance device in accordance with the present invention.

Referring to FIG. 12, a fourth embodiment of a magnetoresistance device 301 according to the present invention is shown.

The fourth magnetoresistance device 301 is similar to the first magnetoresistance device 1 (FIGS. 1 and 2) hereinbefore described. The second device 301 includes a channel 302 extending between and beyond first and second ends 303, 304. The channel 302 has connected thereto, along a first side 305, a shunt 306 and, on a second, opposite effective side 307 of the channel 302, first, second, third and fourth leads $308_1, 308_2, 308_3, 308_4$. The device 301 also includes a top gate structure 312 comprising a gate electrode 313 and gate dielectric 314. The channel 302, shunt 306 and leads $308_1, 308_2, 308_3, 308_4$ are arranged on a silicon dioxide layer 309 disposed on a p-type silicon substrate 310 in the same way as described earlier.

The channel 302, shunt 306, leads $308_1, 308_2, 308_3, 308_4$, gate electrode 313 and gate dielectric 314 have substantially the same thicknesses and are formed from the same materials using the same process as the channel 2 (FIG. 1), shunt 6 (FIG. 1) and leads $8_1, 8_2, 8_3, 8_4$ (FIG. 1), electrode 13 (FIG. 1) and gate dielectric 14 (FIG. 1) described earlier.

The fourth device 301 differs from the first device 1 (FIG. 1) in that the channel 302, shunt 306, leads $308_1, 308_2, 308_3, 308_4$ and gate structure 312 are smaller and have a slightly different arrangement.

The second, third and fourth leads $308_2, 308_3, 308_4$ are spaced apart having spacing, $s_2$, of about 20 nm.

In this case, the leads $308_1, 308_2, 308_3, 308_4$ passing between different parts of the gate structure 313 have a width, $l_3'$, of about 500 nm.

The device 301 is controlled using the same circuit configuration 13 shown in FIG. 3. In operation, the device 301 exhibits the EMR effect and can be used to detect a magnetic field 311 passing or having a component directed along the axis perpendicular to the plane in which the channel 302 and shunt 306 lie.

In the embodiments hereinbefore described, the channel, shunt and leads are formed from the same silicon-on-insulator layer. However, a coplanar arrangement can be achieved in a different way, as will now be described in more detail.

Fifth Embodiment

Figure 13:
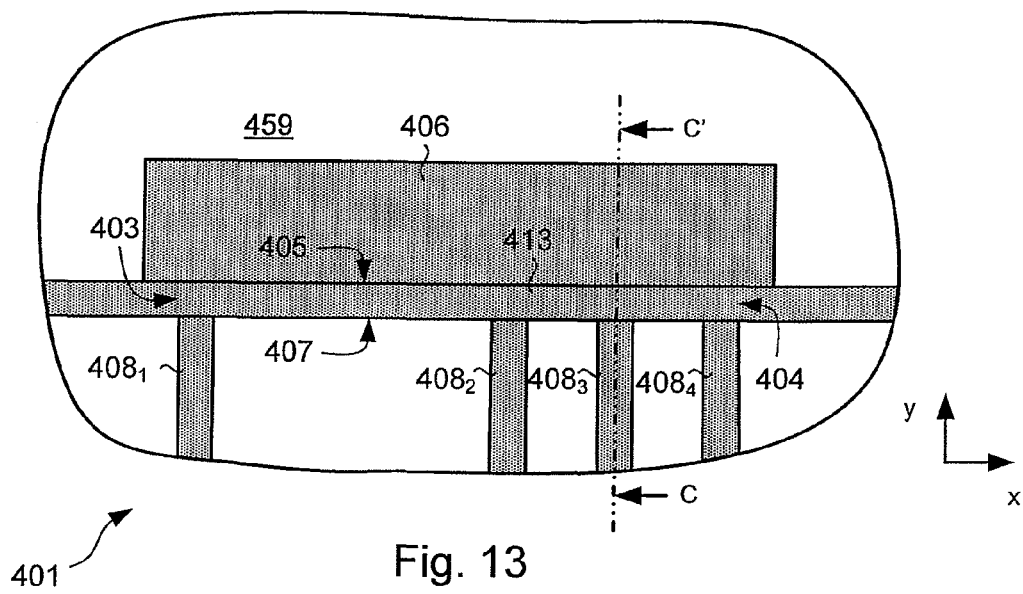
FIG. 13 is a plan view of a fifth embodiment of a magnetoresistance device in accordance with the present invention.
Figure 14:
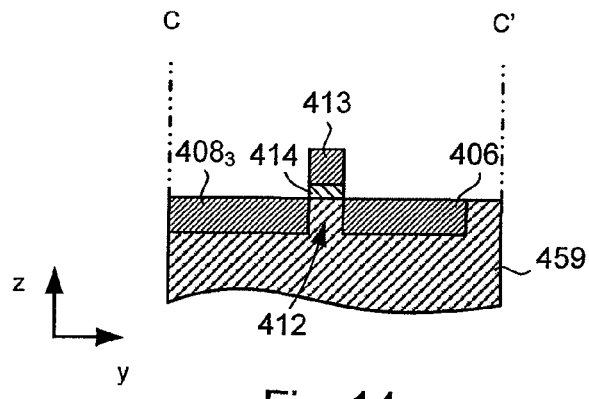
FIG. 14 is a cross-sectional view of the device shown in FIG. 13 taken along the line C-C'.
Figure 15:
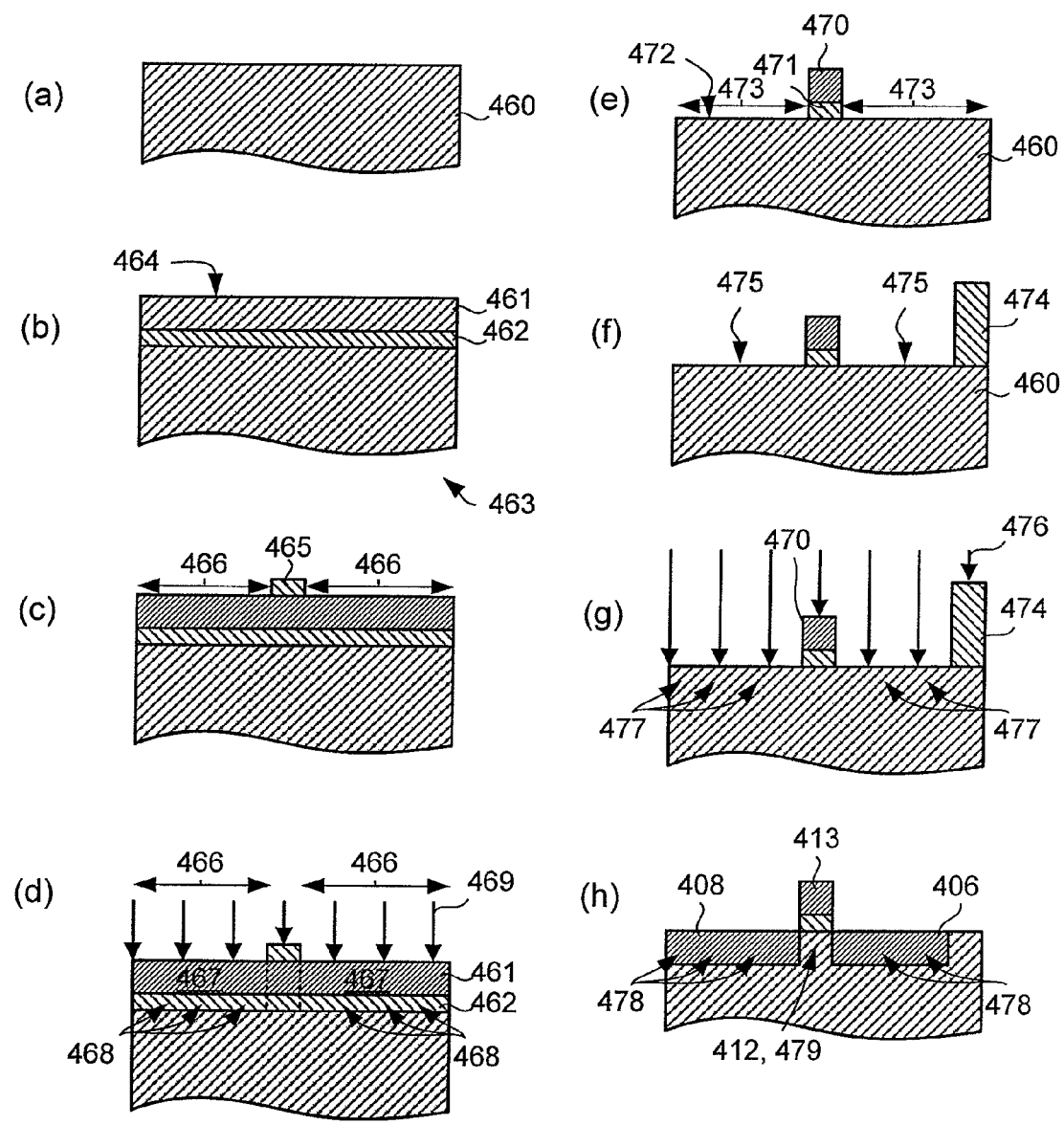
FIGS. 15a to 15h illustrate the device shown in FIG. 13 at different stages during fabrication.

Referring to FIGS. 13 and 14, a fifth embodiment of a magnetoresistance device 401 according to the present invention is shown.

The fifth device 401 includes a channel 402 formed of undoped single crystal silicon (Si). The channel 402 extends between and beyond first and second ends 403, 404 and has connected thereto, along a first side 405, a shunt 406 formed of heavily-doped single crystal silicon having a thickness, $t_2$, of about 20 nm. On a second, opposite side 407 of the channel 402, first, second, third and fourth leads $408_1$, $408_2$, $408_3$, $408_4$ are connected to and spaced apart along the channel 402. The leads $408_1$, $408_2$, $408_3$, $408_4$ are formed of heavily-doped single crystal silicon. The first, second, third and fourth leads $408_1$, $408_2$, $408_3$, $408_4$ are arranged in order along the channel 402 with the first lead $408_1$ closest to the first end 403 (in FIG. 13 shown as the left-hand edge) and the fourth lead $408_4$ closest to the other (i.e. second) end 404.

The shunt 406 connects at least two portions of channel 402. The channel 402, shunt 406 and leads $408_1$, $408_2$, $408_3$, $408_4$ are provided in a bulk undoped silicon substrate 459. The shunt 406 and the leads $408_1$, $408_2$, $408_3$, $408_4$ are connected to the sides 405, 407 of the channel 402, i.e. laterally.

The channel 402 is undoped and the shunt 406 and leads $408_1$, $408_2$, $408_3$, $408_4$ are doped with n-type impurity in the form of arsenic (As) to a concentration of about $1\times10^{20}$ cm$^{-3}$. The shunt 406 and the leads $408_1$, $408_1$, $408_3$, $408_4$ are selectively doped whereas the channel 2 is not doped by using masked ion implantation.

The device 401 includes a top gate structure 412. The gate structure 412 includes a gate electrode 413 formed of a layer of doped polycrystalline silicon (Si) having a thickness, $t_5$, of about 50 nm and a gate dielectric 414 formed from a layer of silicon dioxide (SiO$_2$) having a thickness, $t_6$, of about 2 nm. The gate dielectric 414 separates and electrically isolates the gate electrode 413 from the channel 402. The gate electrode 413 is arranged so that, when the device 1 is in operation, it is perpendicular to an applied magnetic field 411.

The channel 402, shunt 406, leads $408_1$, $408_2$, $408_3$, $408_4$, gate electrode 413 and gate dielectric 414 have substantially the dimensions as the channel 2 (FIG. 1), shunt 6 (FIG. 1) and leads $8_1$, $8_2$, $8_3$, $8_4$ (FIG. 1), electrode 13 (FIG. 1) and gate dielectric 14 (FIG. 1) described earlier.

The device 401 can be controlled using the same circuit configuration 13 shown in FIG. 3.

The device 401 is potentially easier and cheaper to fabricate than the devices 101 (FIG. 1), 201 (FIG. 11), 301 (FIG. 12) described earlier since fewer process steps are required.

Referring to FIGS. 15a to 15h, a method of fabricating the device 401 will now be described.

Referring in particular to FIG. 15a, an undoped silicon wafer 460 is provided. A naturally forming silicon dioxide layer overlying silicon wafer 460 and which is usually referred to as the "surface oxide" is omitted from FIG. 15a for clarity.

The wafer 460 is processed in the following way:

The wafer 460 is cleaned using a Piranha etch. Then, the surface oxide (not shown) is removed by a short dip in a SILOX etch and loaded into a chemical vapour deposition (CVD) reactor chamber (not shown).

Referring in particular to FIG. 15b, a layer 461 of silicon dioxide (SiO$_2$) having a thickness of 2 nm is grown by thermal oxidation followed by a layer 462 of doped polycrystalline silicon having a thickness of 100 nm. Undoped polycrystalline silicon can be used.

At this stage the wafer 463 may be divided into chips. The wafer 463 (or a chip) may be processed further as follows:

The wafer 463 is cleaned using a Piranha etch, followed by a dip in a SILOX etch. A layer (not shown) of polymethylmethacrylate (PMMA) is applied (e.g. spun-on) to an upper surface 464 of the wafer 463 and cured by baking.

The PMMA layer (not shown) is patterned using a scanning electron beam and developed using a mixture of IPA and water to leave a patterned PMMA layer (not shown). The chip is given a short, for example 3-minute, oxygen plasma ash, then a 30-nm thick layer of aluminium is thermally evaporated over the PMMA-patterned surface of the chip. The developed resist is "lifted-off" in acetone, then rinsed in IPA to leave an aluminium etch mask 465 and unmasked areas 466 of the wafer 463 as shown in FIG. 15c.

Referring to FIG. 15d, in the unmasked areas 466, regions 467, 468 of the silicon and silicon dioxide layers 461, 462 are etched by a reactive ion etch 469 using a mixture of carbon tetrafluoride and silicon tetrachloride (CF$_4$:SiCl$_4$) as a feed gas.

The aluminium etch mask 465 is removed using a base, such as (CH$_3$)$_4$NOH.

Referring to FIG. 15e, the structure of the device at this stage in processing is shown. A patterned silicon layer 470 and a coextensive underlying silicon dioxide layer 471 lie on an upper surface 472 of the undoped silicon substrate 460.

The patterned silicon and silicon dioxide layers 470, 471 provide an implantation mask leaving areas 474 of the silicon substrate 460 unmasked.

Referring to FIG. 15f, optical lithography stage leaves a patterned optical resist layer 474 defining the shunt 406 (FIG. 1) and the leads $408_1$, $408_2$, $408_3$, $408_4$ (FIG. 13) and leaving exposed areas 475.

Referring to FIG. 15g, the wafer 460 is cleaned and loaded into an ion implantation chamber (not shown). Arsenic (As) ions 476 at about 5 keV are implanted into the patterned silicon layer 470 (which is unmasked) and unmasked regions 477 of the silicon substrate 460. The wafer is laser annealed to activate the implant.

Referring to FIG. 15h, implantation leaves doped n-type wells 478 corresponding to the shunt 406 and leads 408, an undoped region 479 corresponding to the channel 402 and a doped polycrystalline silicon gate electrode 413.

The wafer is processed still further to form ohmic contacts/contact pads (not shown), e.g. formed for aluminium, for contacting the leads 408 and gate electrode 413.

If not already divided into chips, the wafer is divided into chips at this stage and placed in packages.

A device formed from bulk silicon, as opposed to silicon-on-insulator, and in which the shunt and leads are defined by selective (e.g. masked) implantation, instead of unselective implantation and selective etching, can be simpler to fabricate.

Sixth Embodiment

Figure 16:
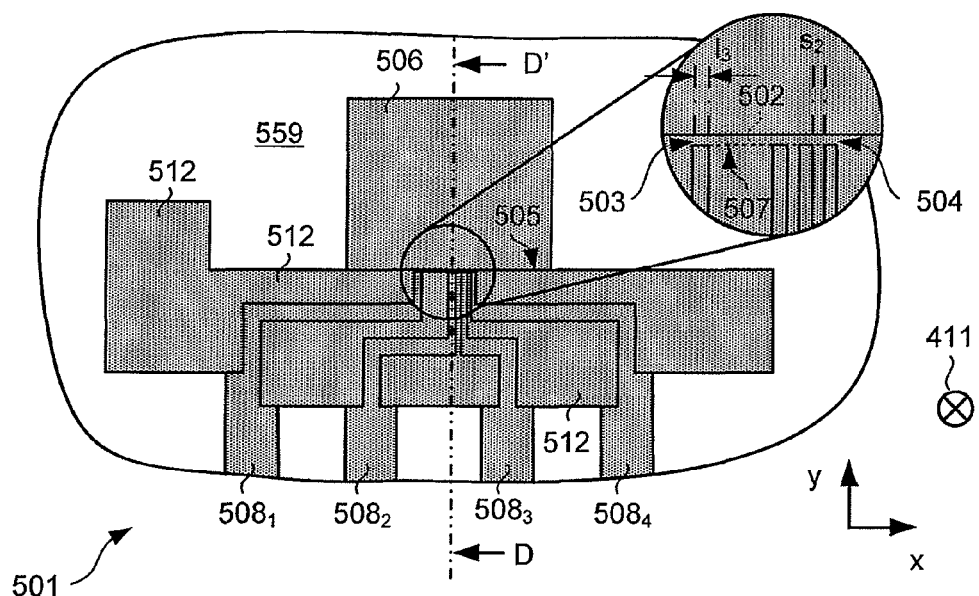
FIG. 16 is a plan view of a sixth embodiment of a magnetoresistance device in accordance with the present invention.
Figure 17:
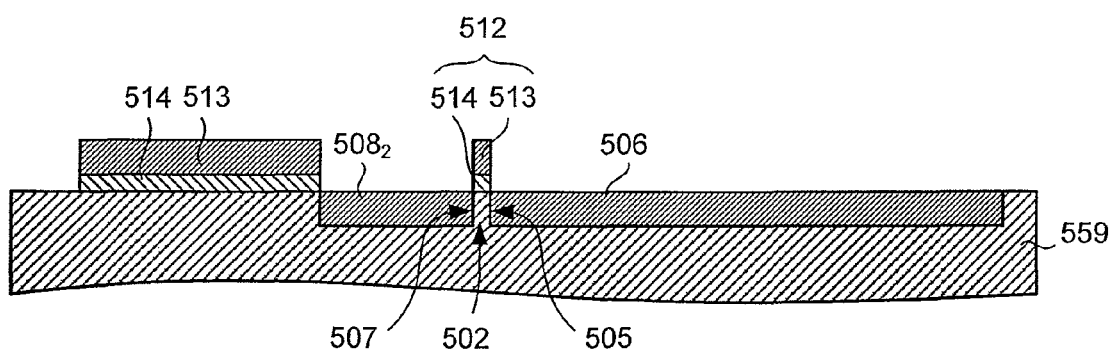
FIG. 17 is a cross-sectional view of the device shown in FIG. 16 taken along the line D-D'.

Referring to FIGS. 16 and 17, a sixth embodiment of a magnetoresistance device 501 according to the present invention is shown.

The sixth magnetoresistance device 501 is similar to the fifth magnetoresistance device 401 (FIGS. 13 and 14) hereinbefore described. The sixth device 501 includes a channel 502 extending at least between first and second points 503, 504. The channel 502 has connected thereto, along a first side 505, a shunt 506 and, on a second, opposite effective side 507 of the channel 502, first, second, third and fourth leads $508_1$, $508_2$, $508_3$, $508_4$. The channel 502, shunt 506 and leads $508_1$, $508_2$, $508_3$, $508_4$ are disposed in an undoped silicon substrate 559. The device 501 also includes a top gate structure 512 comprising a gate electrode 513 and gate dielectric 514.

The channel 502, shunt 506, leads $508_1$, $508_2$, $508_3$, $508_4$, gate electrode 513 and gate dielectric 514 have substantially the same thicknesses and are formed from the same materials using the same process as the channel 402 (FIG. 13), shunt 406 (FIG. 13) and leads $408_1$, $408_2$, $408_3$, $408_4$ (FIG. 13), electrode 413 (FIG. 13) and gate dielectric 414 (FIG. 13) described earlier.

The sixth device 501 differs from the fifth device 401 (FIG. 13) in that the channel 502, shunt 506, leads $508_1$, $508_2$, $508_3$, $508_4$ and gate structure 512 are smaller and have a slightly different arrangement, but is similar to the second device 201 (FIG. 11) in terms of size and arrangement.

The device 501 is controlled using the same circuit configuration 13 shown in FIG. 3. In operation, the device 501 exhibits the EMR effect and can be used to detect a magnetic field 511 perpendicular to the layers in which the channel 502 and shunt 506 are formed.

In the embodiments hereinbefore described, the channel, shunt and leads are formed from silicon. However, silicon-germanium or strained silicon, such as strained silicon-on-insulator (SSOI) can be used, as will now be described in more detail.

Seventh Embodiment

Figure 18:
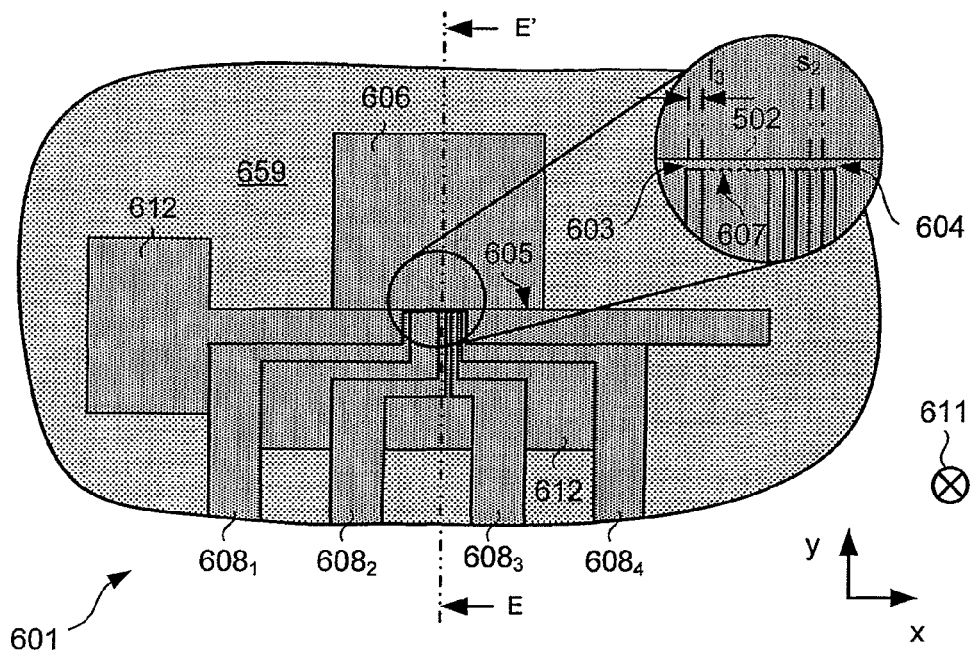
FIG. 18 is a plan view of a seventh embodiment of a magnetoresistance device in accordance with the present invention.
Figure 19:
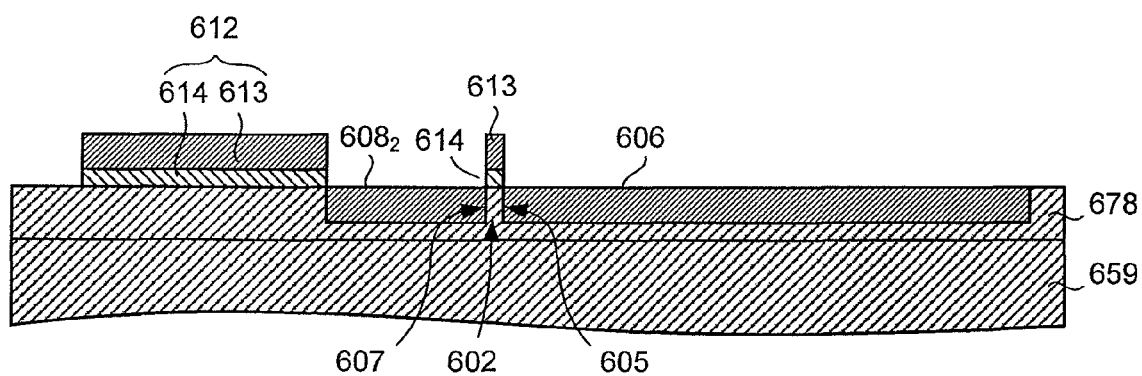
FIG. 19 is a cross-sectional view of the device shown in FIG. 18 taken along the line E-E'.

Referring to FIGS. 18 and 19, a seventh embodiment of a magnetoresistance device 601 according to the present invention is shown.

The seventh magnetoresistance device 601 is similar to the sixth magnetoresistance device 501 (FIGS. 14 and 15) hereinbefore described. The sixth device 601 includes a channel 602 extending between first and second portions 603, 604. The channel 602 has connected thereto, along a first side 605, a shunt 606 and, on a second, opposite open side 607 of the channel 602, first, second, third and fourth leads $608_1$, $608_2$, $608_3$, $608_4$.

The channel 602, shunt 606 and leads $608_1$, $608_2$, $608_3$, $608_4$ are disposed in an epitaxially-grown layer of silicon-germanium 678 lying on an undoped silicon substrate 659. The silicon-germanium layer 678 has a thickness of about 20 nm and comprises $Si_{1-x}Ge_x$, where x is about 0.1.

The device 601 also includes a top gate structure 612 comprising a gate electrode 613 and gate dielectric 614.

The channel 602, shunt 606, leads $608_1$, $608_2$, $608_3$, $608_4$, gate electrode 613 and gate dielectric 614 have substantially the same layer thickness and, except for using silicon-germanium, are formed from the same materials using the same process as the channel 402 (FIG. 13), shunt 406 FIG. 13) and leads $408_1$, $408_2$, $408_3$, $408_4$ (FIG. 13), electrode 413 (FIG. 13) and gate dielectric 414 (FIG. 13) described earlier.

The seventh device 601 also differs from the sixth device 501 (FIG. 15) in that the channel 602, shunt 606, leads $608_1$, $608_2$, $608_3$, $608_4$ and gate structure 612 are smaller and have a slightly different arrangement.

The device 601 is controlled using the same circuit configuration 13 shown in FIG. 3. In operation, the device 601 exhibits the EMR effect and can be used to detect a magnetic field 611 perpendicular to the layers in which the channel 602 and shunt 606 are formed.

In the embodiments hereinbefore described, four leads are used to operate the device. In particular, separate current and voltage leads are used. However, devices may have fewer leads and/or one or more leads being shared which allow smaller devices to be made.

Eighth Embodiment

Figure 20:
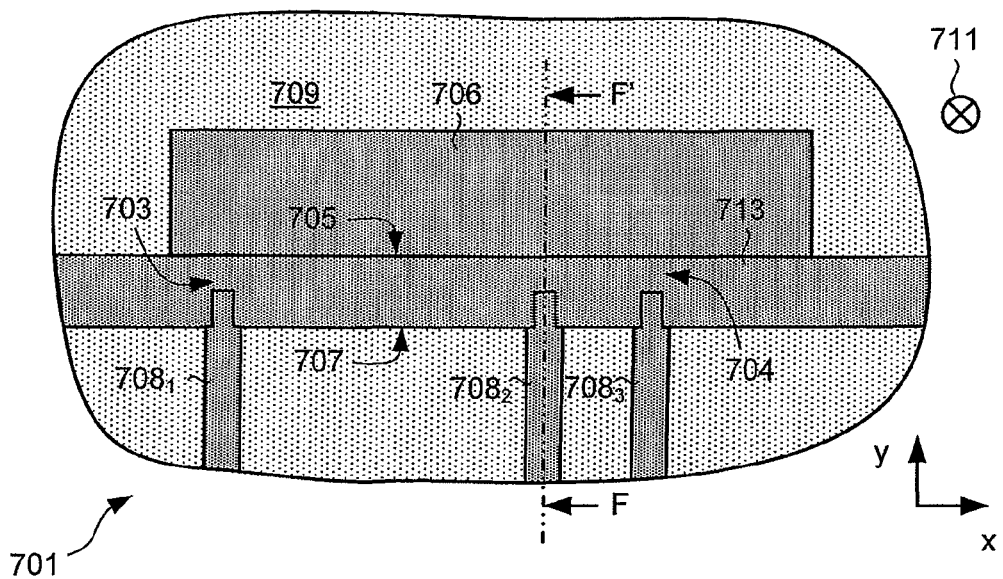
FIG. 20 is a plan view of an eighth embodiment of a magnetoresistance device in accordance with the present invention.
Figure 21:
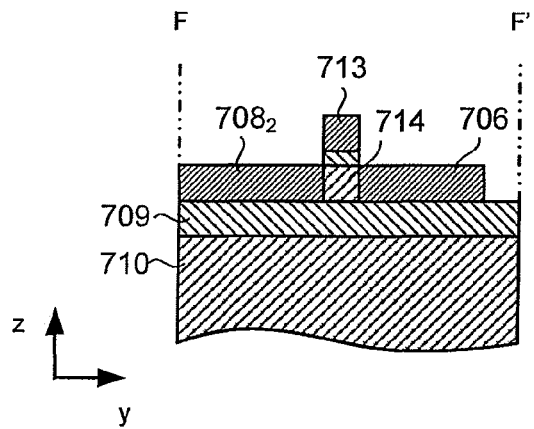
FIG. 21 is a cross-sectional view of the device shown in FIG. 20 taken along the line F-F'.

Referring to FIGS. 20 and 21, an eighth embodiment of a magnetoresistance device 701 according to the present invention is shown.

The eighth magnetoresistance device 701 is similar to the second magnetoresistance device 101 (FIGS. 9 and 10) hereinbefore described. The eighth device 701 includes a channel 702 extending between first and second ends 703, 704. The channel 702 has connected thereto, along a first side 705, a shunt 706 and, on a second, opposite effective side 707 of the channel 702, first, second and third leads $708_1$, $708_2$, $708_3$. The device 701 also includes a top gate structure 712 comprising a gate electrode 713 and gate dielectric 714. The channel 702, shunt 706 and leads $708_1$, $708_2$, $708_3$ are arranged on a silicon dioxide layer 709 disposed on a p-type silicon substrate 710 in the same way as described earlier.

The channel 702, shunt 706, leads $708_1$, $708_2$, $708_3$, gate electrode 713 and gate dielectric 714 have substantially the same thicknesses and dimensions, and are formed from the same materials using the same process, as the channel 2 (FIG. 1), shunt 6 (FIG. 1) and leads $8_1$, $8_2$, $8_3$ (FIG. 1), electrode 13 (FIG. 1) and gate dielectric 14 (FIG. 1) described earlier. The effective length of the channel 702 is shorter due to the arrangements of the leads $708_1$, $708_2$, $708_3$.

The device need not be formed using silicon-on-insulator, but can be formed in bulk silicon using implantation as described earlier.

Figure 22:
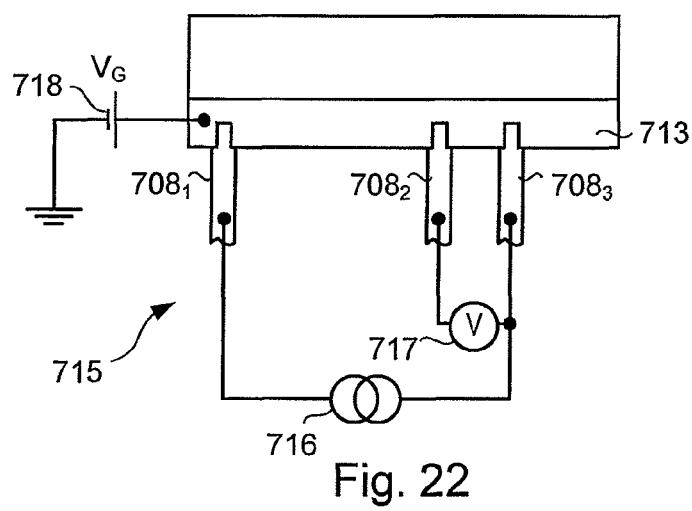
FIG. 22 is a schematic view of circuit arrangement for operating the device shown in FIG. 20.

Referring to FIG. 22, a circuit configuration 715 for operating the magnetoresistance device 701 is shown. The circuit configuration 715 includes a current source 716 configured to drive current, I, through the channel 702 between the first lead $708_1$ and the third lead $708_3$ and a voltmeter 717 configured to measure voltage, V, developed across the second and third leads $708_2$, $708_3$. A voltage source 718 is used to apply a bias, $V_G$, to the gate electrode 713.

The circuit configuration 715 can be used to operate one of the devices described earlier which have four leads, but in which one of the leads, e.g. the fourth lead, is not used.

Ninth Embodiment

Figure 23:
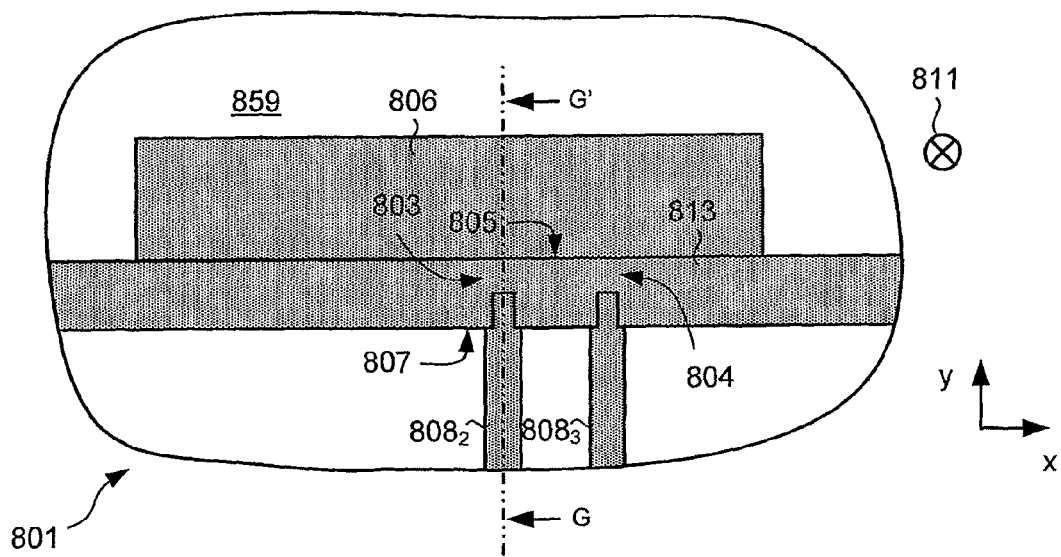
FIG. 23 is a plan view of a ninth embodiment of a magnetoresistance device in accordance with the present invention.
Figure 24:
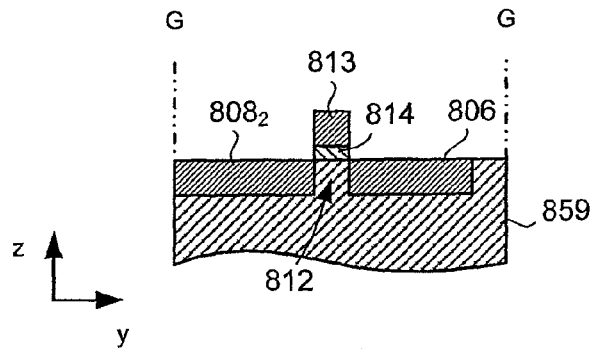
FIG. 24 is a cross-sectional view of the device shown in FIG. 23 taken along the line G-G'.

Referring to FIGS. 23 and 24, a ninth embodiment of a magnetoresistance device 801 according to the present invention is shown.

The ninth magnetoresistance device 801 is similar to the fifth magnetoresistance device 401 (FIGS. 13 and 14) hereinbefore described. The magnetoresistance device 801 includes a channel 802 extending between first and second ends 803, 804. The channel 802 has connected thereto, along a first side 805, a shunt 806 and, on a second, opposite side 807 of the channel 802, first and second leads $808_2$, $808_3$. The channel 802, shunt 806 and leads $808_2$, $808_3$ are disposed in an undoped silicon substrate 859. The device 501 also includes a top gate structure 512 comprising a gate electrode 513 and gate dielectric 514.

The channel 802, shunt 806, leads $808_2$, $808_3$, gate electrode 813 and gate dielectric 814 have substantially the same thicknesses and dimensions, and are formed from the same materials using the same process, as the channel 2 (FIG. 1), shunt 6 (FIG. 1) and leads $8_2$, $8_3$, (FIG. 1), electrode 13 (FIG. 1) and gate dielectric 14 (FIG. 1) described earlier.

The device need not be formed using silicon-on-insulator, but can be formed in bulk silicon using implantation as described earlier.

Figure 25:
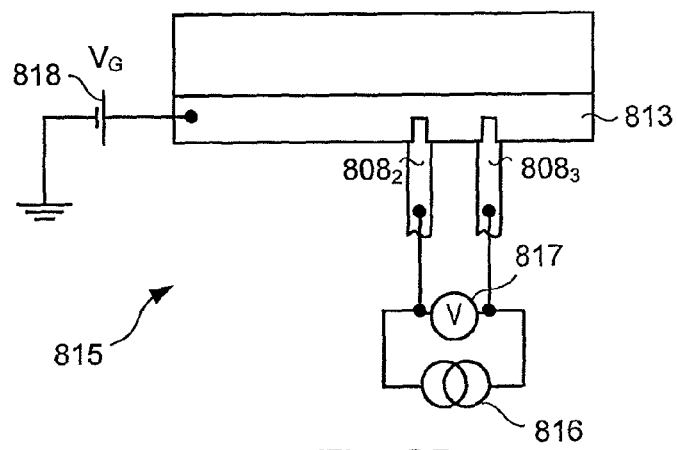
FIG. 25 is a schematic view of circuit arrangement for operating the device shown in FIG. 23.

Referring to FIG. 25, a circuit configuration 815 for operating the magnetoresistance device 801 is shown. The circuit configuration 815 includes a current source 816 configured to drive current, I, through the channel 802 between the second lead $808_2$ and the third lead $808_2$ and a voltmeter 817 configured to measure voltage, V, developed across the second and third leads $808_2$, $808_3$. A voltage source 818 is used to apply a bias, $V_G$, to the gate electrode 813.

The circuit configuration 815 can be used to operate one of the devices described earlier which have four leads, but in which two of the leads, e.g. the first and fourth leads, are not used.

Figure 26:
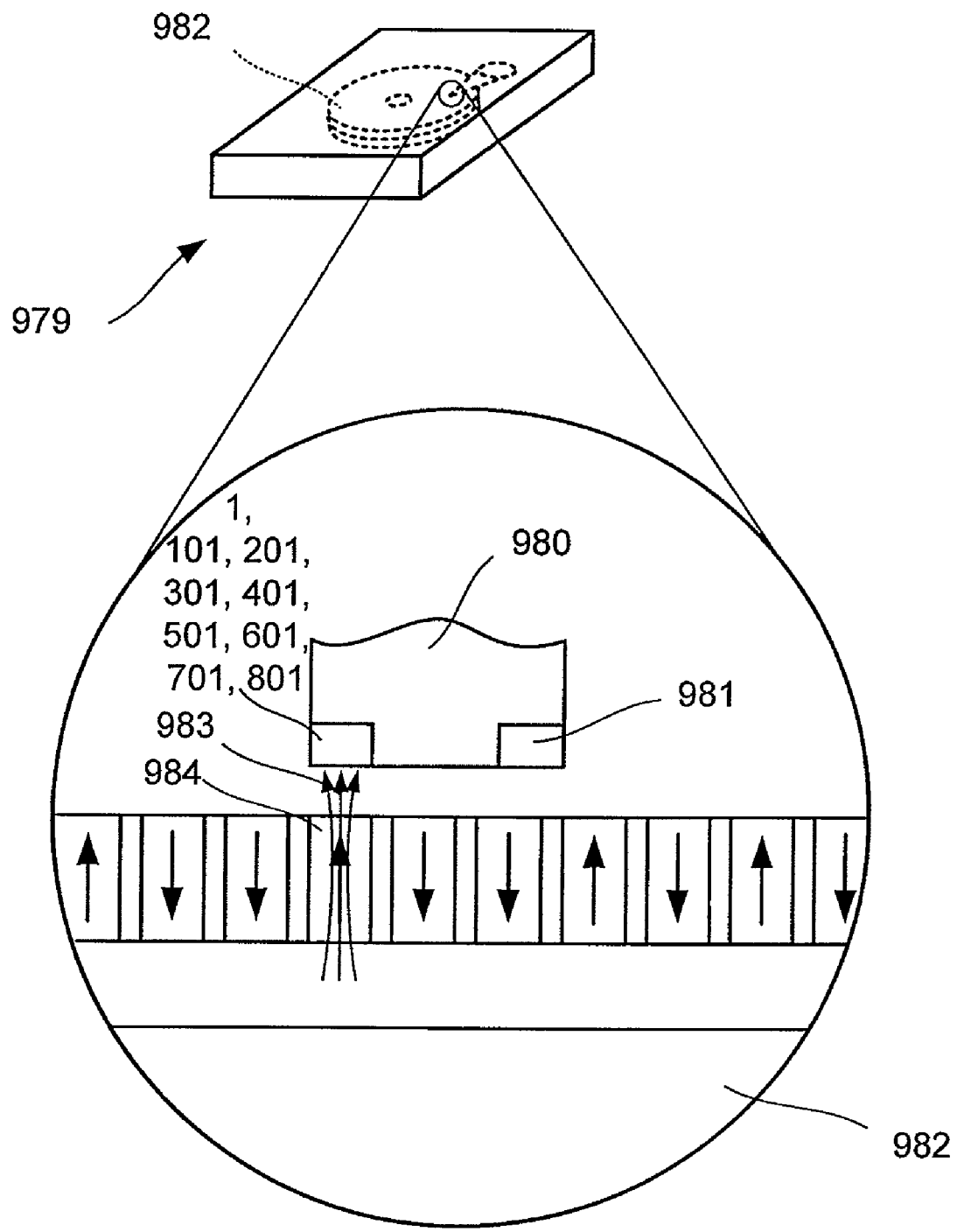
FIG. 26 is a schematic view of a hard disk driving including a magnetoresistance device in accordance with the present invention.

Referring to FIG. 26, the device 1, 101, 201, 301, 401, 501, 601, 701, 801 is useable as a read head in a hard disk drive 979. A slider 980 supports the device 1, 101, 201, 301, 401, 501, 601, 701, 801 (inverted with respect to the configuration, for example, shown in FIG. 2) and a write head 981 over a rotatable platen 982. The device 1, 101, 201, 301, 401, 501, 601, 701, 801 measures magnetic field 983 produced by a perpendicularly-arranged bit cell 984 passing beneath it. The device 1, 101, 201, 301, 401, 501, 601, 701, 801 may be used in a hard disk drive having longitudinally-arranged bit cells.

It will be appreciated that many modifications may be made to the embodiments hereinbefore described.

A bottom gate structure may be used in which the gate electrode lies under a gate dielectric and the gate dielectric lies under the channel.

The gate electrode may be doped with an impurity (n-type or p-type) having a concentration of at least about $1\times10^{19}$ cm$^{-3}$, for example about $1\times10^{21}$ cm$^{-3}$.

The gate electrode need not comprise silicon, but may be formed from a metal, such as aluminium (Al) or gold (Au), or metal alloy. The gate electrode may include one or more layers. For example, the gate electrode may be a bi-layer, e.g. titanium (Ti) and gold (Au).

The device may be a silicon-based device. For example the channel, shunt and/or the leads may comprise a silicon-containing material, such as silicon or silicon-germanium (e.g. $Si_{0.9}Ge_{0.1}$). Different silicon-containing materials can be used in different parts of the device. The channel may comprise silicon germanium. Other elemental semiconductors, such as germanium, can be used. Compound semiconductors may be used, such as gallium arsenide (GaAs), indium arsenide (InAs) and indium antimonide (InSb) and other binary semiconductors and tertiary and quaternary semiconductors may be used. Heterostructures, such as AlGaAs/GaAs, may be used.

The channel, shunt and/or the leads may be formed in single crystal silicon (or other semiconductor material).

The channel may be undoped or doped with an impurity (n-type or p-type) up to a concentration of about $1\times10^{15}$ cm$^{-3}$, up to a concentration of about $1\times10^{16}$ cm$^{-3}$ or up to a concentration of about $1\times10^{17}$ cm$^{-3}$.

The shunt and/or the leads may be doped with an impurity (n-type or p-type) having a concentration of at least about $1\times10^{19}$ cm$^{-3}$, for example about $1\times10^{21}$ cm$^{-3}$, and/or may comprise one or more δ-doped layers.

The channel and/or shunt and/or leads may be provided in a layer or respective layers having a different thickness to the layer described earlier. For example, the channel and/or shunt and/or leads may have a thickness between about 5 to 50 nm or a thickness between about 50 nm to 100 nm. Furthermore, the channel, shunt and leads may have different thicknesses. For example, the channel may be thinner than the shunt and leads. Different thicknesses may be achieved by depositing layers of different thicknesses or by masked etching.

The shunt may extend along a portion of the channel, i.e. less than the full length of the channel. The shunt need not be rectangular.

The leads may each have a thickness less than 50 nm. The channel may have a width (i.e. $w_1$) less than 100 nm and/or a length (i.e. $l_1$) less than 10 μm. The shunt may have a width (i.e. $w_2$) up to 500 nm and/or a length (i.e. $l_2$) less than 10 μm which may or may not be the same as the length of the channel. The leads may each have a width (i.e. $l_3$) up to 200 nm, the width being in a direction which corresponds to length for the channel. The leads need not be arranged perpendicularly with respect to the channel. End leads, for example first and sixth leads $8_1$, $8_4$ (FIG. 1), may be arranged to approach the channel, e.g. channel 2 (FIG. 1), from the ends, e.g. ends 3, 4 (FIG. 1) of the channel, rather than transversely. At least some of the leads can be arranged above and/or below the channel, i.e. underlie and/or overlie the channel. The shunt and the leads need not be arranged on opposite sides (or surfaces) of the channel.

An insulating layer which provides electrical insulation can be thicker or thinner than 150 nm.

Other concentrations and mixtures for etches and developers may be used. Other etches, resists and developers may be used. Etching, exposure and development time can be varied and can be found by routine experiment. The anneal temperature may also be found by routine experiment.

The invention claimed is:

1. A magnetoresistance device having:
    a channel comprising non-ferromagnetic semiconducting material;
    a conductor comprising non-ferromagnetic material having a higher conductivity than the semiconducting material and connecting at least two sections of the channel;
    a plurality of leads connected to and spaced apart along the channel; and
    a gate structure comprising a gate electrode separated from the channel by a gate dielectric for applying an electric field to the channel;
    wherein the channel comprises silicon or silicon germanium.

2. The device according to claim 1, wherein the channel is undoped or is doped with an impurity having a concentration up to about $1\times10^{16}$ cm$^{-3}$.

3. The device according to claim 1, wherein the conductor is arranged laterally to the channel and/or the conductor extends along the channel.

4. The device according to claim 1, wherein the conductor comprises semiconducting material and, optionally, the conductor comprises silicon.

5. The device according to claim 4, wherein the conductor is doped with an impurity having a concentration of at least about $1\times10^{19}$ cm$^{-3}$.

6. The device according to claim 1, wherein the channel and the conductor are coplanar.

7. The device according to claim 6, wherein the channel and conductor are provided in a layer of semiconducting material.

8. The device according to claim 6, wherein the channel and conductor are provided in a semiconductor substrate at its surface.

9. The device according to claim 1, wherein the gate structure is a top gate structure wherein the gate dielectric is disposed on the channel and the gate electrode is disposed on the gate dielectric.

10. The device according to claim 1, wherein the gate electrode comprises a semiconducting material and, optionally, the semiconducting material comprises silicon.

11. The device according to claim 1, which is a read head for a hard disk drive.

12. Apparatus comprising:
    the device according to claim 1; and
    a magnetic field source;
    the magnetic field source and device arranged such that, when a magnetic field is applied to the device, the magnetic field is arranged along a line passing substantially perpendicularly through the gate electrode and the channel.

13. A method of operating a magnetoresistance device having a channel comprising non-ferromagnetic semiconducting material, a conductor comprising non-ferromagnetic material having a higher conductivity than the semiconducting material and connecting at least two sections of the channel, a plurality of leads connected to and spaced apart along the channel and a gate structure comprising a gate electrode separated from the channel by a gate dielectric for applying an electric field to the channel, the method comprising:

applying a bias of appropriate polarity and sufficient magnitude so as to result in formation of an inversion layer in the non-ferromagnetic semiconducting material;

wherein the channel comprises silicon or silicon germanium.

14. The method according to claim 13, further comprising: driving a current between two leads; and
measuring a voltage developed between two leads.

15. A method of fabricating a magnetoresistance device, the method comprising:

providing a layer of non-ferromagnetic semiconducting material;

providing a layer of insulating material on the semiconducting material layer;

providing a layer of conducting material on the insulating material layer;

patterning said insulating and conducting material layers so as to form a mask and define unmasked regions of the semiconducting material layer; and implanting ions into the unmasked regions of the semiconducting material layer.

16. The method according to claim 15, wherein providing a layer of non-ferromagnetic semiconducting material comprises providing a doped substrate.

17. The method according to claim 15, wherein providing a layer of non-ferromagnetic semiconducting material comprises providing the layer on an underlying insulating layer.

* * * * *